United States Patent
Chae et al.

(10) Patent No.: US 9,246,048 B2
(45) Date of Patent: Jan. 26, 2016

(54) SEMICONDUCTOR LIGHT EMITTING DEVICES HAVING AN UNEVEN EMISSION PATTERN LAYER AND METHODS OF MANUFACTURING THE SAME

(71) Applicant: Samsung Electronics Co., Ltd., Suwon-Si, Gyeonggi-Do (KR)

(72) Inventors: Su-hee Chae, Suwon-si (KR);
Young-soo Park, Yongin-si (KR);
Bok-ki Min, Suwon-si (KR); Jun-youn Kim, Hwaseong-si (KR); Hyun-gi Hong, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/564,928

(22) Filed: Dec. 9, 2014

(65) Prior Publication Data
US 2015/0093848 A1 Apr. 2, 2015

Related U.S. Application Data

(62) Division of application No. 12/929,149, filed on Jan. 4, 2011, now Pat. No. 8,928,017.

(30) Foreign Application Priority Data

Jul. 26, 2010 (KR) .................. 10-2010-0071976

(51) Int. Cl.
*H01L 21/00* (2006.01)
*H01L 33/00* (2010.01)
*H01L 33/38* (2010.01)
(Continued)

(52) U.S. Cl.
CPC ........ *H01L 33/0066* (2013.01); *H01L 33/0075* (2013.01); *H01L 33/0079* (2013.01); *H01L 33/12* (2013.01); *H01L 33/24* (2013.01); *H01L 33/382* (2013.01); *H01L 33/22* (2013.01); *H01L 33/405* (2013.01); *H01L 2933/0016* (2013.01)

(58) Field of Classification Search
CPC ............ H01L 2933/0016; H01L 33/22; H01L 33/382
USPC .......... 438/29, 46, 47; 257/94, 95, 96, 97, 98, 257/99, 103, E33.023, E33.025, E33.026, 257/E33.027, E33.028, E33.03, E33.032, 257/E33.033, E33.034, E33.062, E33.065, 257/E33.067, E33.068
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |

(Continued)

FOREIGN PATENT DOCUMENTS

| | | | | |
|---|---|---|---|---|
| DK | WO 2009/155897 | * 12/2009 | .............. | H01L 33/00 |
| KR | 1020060066871 A | 6/2006 | | |

(Continued)

*Primary Examiner* — Jay C Kim
(74) *Attorney, Agent, or Firm* — Harness, Dickey & Pierce, P.L.C.

(57) ABSTRACT

Example embodiments are directed to light-emitting devices (LEDs) and methods of manufacturing the same. The LED includes a first semiconductor layer; a second semiconductor layer; an active layer formed between the first and second semiconductor layers; and an emission pattern layer including a plurality of layers on the first semiconductor layer, the emission pattern including an emission pattern for externally emitting light generated from the active layer.

8 Claims, 6 Drawing Sheets

(51) Int. Cl.
   *H01L 33/12*  (2010.01)
   *H01L 33/24*  (2010.01)
   H01L 33/22  (2010.01)
   H01L 33/40  (2010.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,736,945 B2 * | 6/2010 | Schiaffino et al. | 438/106 |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,821,024 B2 | 10/2010 | Jeong | |
| 7,875,534 B2 * | 1/2011 | Yu et al. | 438/483 |
| 7,910,395 B2 * | 3/2011 | Shei | H01L 27/156 257/E21.053 |
| 7,940,350 B2 | 5/2011 | Jeong | |
| 7,959,312 B2 | 6/2011 | Yoo et al. | |
| 7,964,881 B2 | 6/2011 | Choi et al. | |
| 7,968,355 B2 * | 6/2011 | Kim | H01L 33/0079 257/E21.527 |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,258,533 B2 * | 9/2012 | Seo | H01L 25/0753 257/100 |
| 8,263,987 B2 | 9/2012 | Choi et al. | |
| 8,283,191 B2 * | 10/2012 | Rode et al. | 438/29 |
| 8,324,646 B2 | 12/2012 | Lee et al. | |
| 8,362,506 B2 * | 1/2013 | Rode et al. | 257/98 |
| 8,390,021 B2 * | 3/2013 | Nagai | H01L 27/156 257/99 |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,569,772 B2 * | 10/2013 | Kim | H01L 33/387 257/676 |
| 8,710,537 B2 * | 4/2014 | Engl | H01L 27/15 257/99 |
| 8,735,931 B2 | 5/2014 | Han et al. | |
| 8,766,295 B2 | 7/2014 | Kim | |
| 8,823,024 B2 * | 9/2014 | Engl | H01L 27/156 257/93 |
| 2004/0119063 A1 * | 6/2004 | Guo et al. | 257/13 |
| 2007/0197004 A1 | 8/2007 | Dadgar et al. | |
| 2008/0191215 A1 | 8/2008 | Choi et al. | |
| 2010/0120183 A1 * | 5/2010 | Kim et al. | 438/29 |

FOREIGN PATENT DOCUMENTS

| | | |
|---|---|---|
| KR | 10-0865754 B1 | 10/2008 |
| KR | 1020090018451 A | 2/2009 |
| KR | 10-0892664 B1 | 4/2009 |
| KR | 10-0893260 B1 | 4/2009 |
| KR | 1020090089975 A | 8/2009 |
| KR | 10-0930187 B1 | 12/2009 |

* cited by examiner

SEMICONDUCTOR LIGHT EMITTING DEVICES HAVING AN UNEVEN EMISSION PATTERN LAYER AND METHODS OF MANUFACTURING THE SAME

CROSS-REFERENCE TO RELATED APPLICATIONS

This application is a divisional application of U.S. application Ser. No. 12/929,149, filed Jan. 4, 2011, and claims priority under 35 U.S.C. §119 to Korean Patent Application No. 10-2010-0071976, filed on Jul. 26, 2010, in the Korean Intellectual Property Office, the disclosure of each of which is incorporated herein in their entirety by reference.

BACKGROUND

1. Field

Example embodiments relate to light-emitting devices (LEDs) and methods of manufacturing the same.

2. Description of the Related Art

Semiconductor light-emitting devices (LEDs) are highly efficient and environment-friendly light sources that are used in various devices such as displays, optical communication devices, vehicles, and/or general lamps. Currently, as a result of the development of white light LEDs, LED technology is also found in general purpose lamps. A white light LED may be formed by combining, for example, a blue or ultraviolet LED and a phosphor, or combining red, green, and blue LEDs.

A blue or ultraviolet LED that is a main component of a white light LED is formed by using a gallium nitride (GaN)-based compound semiconductor. A GaN-based compound semiconductor has a wide bandgap and may emit light of almost all wavelengths from ultraviolet light to visual light, according to the composition of a nitride.

Typically, a thin film-type GaN LED is formed by growing a GaN thin film on a sapphire ($Al_2O_3$) substrate. However, if a GaN-based compound semiconductor is grown on a sapphire substrate in the form of a thin film, light emitting efficiency is reduced due to a mismatch in lattice constant or a difference in thermal expansion coefficient, and large area growth is difficult, and thus manufacturing costs may increase. Also, when a laser lift-off (LLO) process is performed to remove a sapphire substrate after growing a GaN thin film, the output of light may be reduced due to laser impact.

In order to increase a manufacturing yield and reduce manufacturing costs of LEDs, a method of manufacturing a GaN LED using a silicon substrate is currently suggested. A silicon substrate having a wafer of a diameter greater than 12 inches may exhibit less warping in a high temperature process as compared to a sapphire substrate. Also, if a silicon substrate is used, after growing a GaN thin film, the silicon substrate may be removed without performing an LLO process and thus the output of light may not be reduced.

SUMMARY

According to example embodiments, a light-emitting device (LED) includes a first semiconductor layer of a first impurity type; a second semiconductor layer of a second impurity type; an active layer between the first and second semiconductor layers; and an emission pattern layer on the first semiconductor layer, the emission pattern layer including a plurality of layers and having an emission pattern that externally emits light generated from the active layer.

According to example embodiments, the emission pattern layer comprises an aluminum nitride (AlN) layer and an aluminum gallium nitride (AlGaN) layer.

According to example embodiments, the emission pattern layer comprises an AlN layer, and AlGaN layers and gallium nitride (GaN) layers alternately formed on the AlN layer.

According to example embodiments, the LED, further includes a metal layer under the second semiconductor layer and configured to reflect light generated from the active layer toward the emission pattern layer.

According to example embodiments, the LED, further includes an insulating layer between the metal layer and the second semiconductor layer.

According to example embodiments, the LED, further includes a first contact layer that penetrates the insulating layer, the second semiconductor layer, and the active layer, and contacts the first semiconductor layer and the metal layer.

According to example embodiments, the LED, further includes a second contact layer on a portion between the insulating layer and the second semiconductor layer, the second contact layer penetrating the second semiconductor layer, the active layer, and the first semiconductor layer.

According to example embodiments, the LED, further includes a GaN layer between the first semiconductor layer and the emission pattern layer.

According to example embodiments, the emission pattern is uneven.

According to example embodiments, a depth of the uneven emission pattern is from about 500 nm to about 1500 nm.

According to example embodiments, a method of manufacturing a light-emitting device (LED) includes forming a buffer layer on a first substrate; sequentially forming a first semiconductor layer of a first impurity type, an active layer, and a second semiconductor layer of the second impurity type on the buffer layer; forming a first contact layer contacting the first semiconductor layer, and a second contact layer contacting the second semiconductor layer; and forming an emission pattern layer by removing the first substrate and patterning the buffer layer.

According to example embodiments, the forming of the first and second contact layers includes forming a first through hole penetrating through the second semiconductor layer and the active layer to expose a portion of the first semiconductor layer; forming an insulating layer on a surface of the second semiconductor layer and a sidewall of the first through hole; forming the first contact layer by filling the first through hole with metal; and forming the second contact layer by using metal on a portion of the second semiconductor layer, the second semiconductor layer being exposed by etching a portion of the insulating layer on the second semiconductor layer, and covering the second contact layer with an insulator.

According to example embodiments, the method, further includes forming a metal layer on the insulating layer and the first contact layer.

According to example embodiments, the method, further includes bonding a second substrate on the metal layer and removing the first substrate.

According to example embodiments, the method, further includes forming a second through hole penetrating through the emission pattern layer, the first semiconductor layer, the active layer, and the second semiconductor layer to expose the second contact layer; and filling the second through hole with metal to contact the second contact layer.

According to example embodiments, the method, further includes removing the first substrate using a lapping process or an etching process.

According to example embodiments, the buffer layer includes an aluminum nitride (AlN) layer and an aluminum gallium nitride (AlGaN) layer.

According to example embodiments, the buffer layer includes an AlN layer, and AlGaN layers and gallium nitride (GaN) layers alternately formed on the AlN layer.

According to example embodiments, the method, further includes forming an uneven emission pattern layer on the buffer layer.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
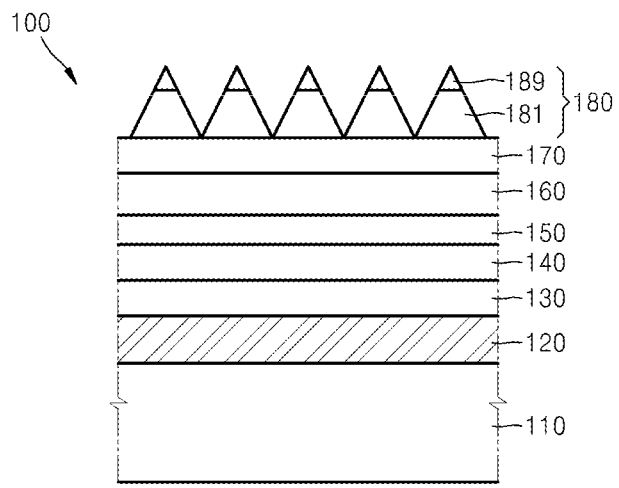
FIG. 1 is a cross-sectional view of a light-emitting device (LED) according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view of a light-emitting device (LED) 100 according to example embodiments. Referring to FIG. 1, the LED 100 includes first type and second type semiconductor layers 160 and 140 formed on a substrate 110, an active layer 150 formed between the first type and second type semiconductor layers 160 and 140, and an emission pattern layer 180 on the first type semiconductor layer 160, including a plurality of layers, and having an emission pattern for externally emitting light generated from the active layer 150.

A metal layer 120 that reflects light generated from the active layer 150 in the direction of the substrate 110 such that the light is externally emitted through the emission pattern layer 180 may be under the second type semiconductor layer 140.

An insulating layer 130 may be formed between the metal layer 120 and the second type semiconductor layer 140. The insulating layer 130 insulates a first contact layer (not shown) contacting and applies a voltage to the first type semiconductor layer 160, from a second contact layer (not shown) contacting and for applying a voltage to the second type semiconductor layer 140. Detailed structures of the first and second contact layers will be described later with reference to FIG. 3A.

A gallium nitride (GaN) layer 170 may be further prepared between the first type semiconductor layer 160 and the emission pattern layer 180. The GaN layer 170 is not doped with impurities and may be formed as a part of a buffer layer.

The first type semiconductor layer 160 may be formed of a nitride semiconductor doped with an n-type impurity, e.g., n-$Al_xGa_yIn_zN$ (x+y+z=1). The second type semiconductor layer 140 may be formed of a nitride semiconductor doped with a p-type impurity, e.g., p-$Al_xGa_yIn_zN$ (x+y+z=1). The active layer 150 may include single or multiple quantum wells obtained by varying x, y, and z values in $Al_xGa_yIn_zN$ to adjust a bandgap. A light emission wavelength varies according to a mole fraction of indium (In) in indium gallium nitride (InGaN) used in forming the active layer 150. For example, as the content of In increases, a color of emitted light changes to a long wavelength band.

The emission pattern layer 180 is such that a majority of light generated from the active layer 150 is externally emitted from the LED 100. The emission pattern layer 180 may include an aluminum gallium nitride (AlGaN) layer 181 and an aluminum nitride (AlN) layer 189. As will be described later, the AlN layer 189 and the AlGaN layer 181 are formed as a buffer layer for growing nitride thin films on a heterogeneous substrate. In example embodiments, the emission pattern is formed by texturing a surface of the buffer layer. The AlN layer 189 and the AlGaN layer 181 may be etched to have an uneven pattern having V-shaped recesses, for example.

The depth of the uneven pattern may be from about 500 nm to about 1500 nm. Although the depth of the uneven pattern is the same as the sum of the thicknesses of the AlN layer 189 and the AlGaN layer 181 in FIG. 1, example embodiments are not limited thereto and the depth of the uneven pattern may vary to a desired depth in the AlGaN layer 181 or the GaN layer 170.

Although the emission pattern layer 180 has the uneven pattern formed by etching the AlGaN layer 181 and the AlN layer 189 in FIG. 1, example embodiments are not limited thereto and the emission pattern layer 180 may have the uneven pattern formed by performing a surface texturing process to a predetermined/desired depth into the GaN layer 170.

Figure 2:
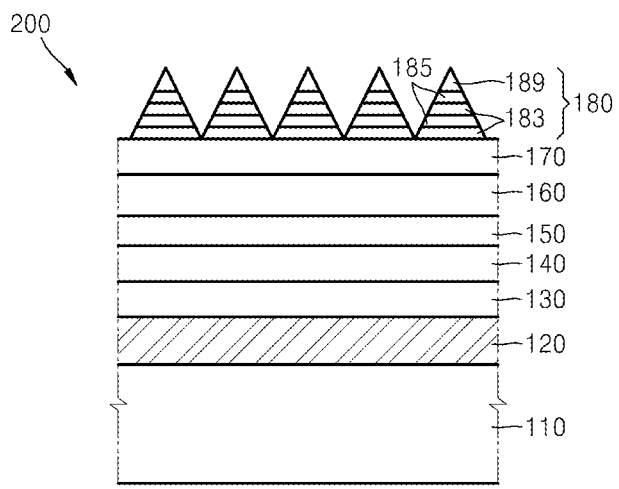
FIG. 2 is a cross-sectional view of an LED according to example embodiments.

FIG. 2 is a cross-sectional view of an LED 200 according to example embodiments. FIG. 2 is different from FIG. 1 in layers included in the emission pattern layer 180. The emission pattern layer 180 of the present embodiment includes the AlN layer 189, and AlGaN layers 185 and GaN layers 183 alternately formed below the AlN layer 189. Although two AlGaN layers 185 and two GaN layers 183 are alternately formed in FIG. 2, example embodiments are not limited thereto.

FIGS. 3A through 3L are cross-sectional views describing a method of manufacturing an LED 300, according to example embodiments.

Figure 3A:
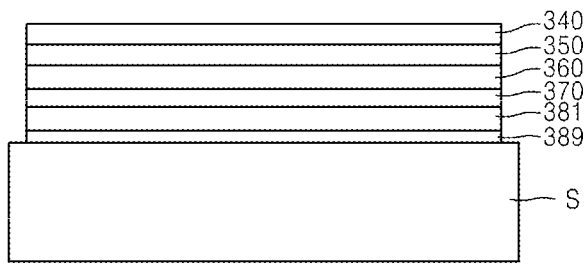
FIGS. 3A through 3L are cross-sectional views for describing a method of manufacturing an LED, according to example embodiments.

Referring to FIG. 3A, initially, an AlN layer 389, an AlGaN layer 381, a GaN layer 370, a first type semiconductor layer 360, an active layer 350, and a second type semiconductor layer 340 are sequentially formed on a first substrate S.

The first substrate S may be, for example, a silicon substrate, Si(111).

The AlN layer 389 and the AlGaN layer 381 are formed as a buffer layer for growing nitride thin films. AlN for forming the AlN layer 389 is a compound semiconductor in a wurtzite crystal having partial ionic bonding characteristics of aluminum (Al) and nitrogen (N) atoms and having a covalent bond hexagonal structure, has the largest energy bandgap from among Group III-V semiconductors, and has crystalline structural anisotropy and a stoichiometric bonding structure. Also, AlN has high elasticity, high heat conductivity, thermal stability, excellent transmittance and high refractive index in a range from visual light to infrared light, and stability at room-temperature atmospheric pressure. AlN may be used together with AlGaN as a buffer layer for growing high-quality nitride thin films having relatively for dislocation or cracks. The thickness of the buffer layer may be from about 200 nm to about 3 um and may be determined to suppress the occurrence of dislocation or cracks when growing the nitride thin films and to ensure a desired crack-free thickness. The buffer layer is not limited to the structure illustrated in FIG. 3A and may have a structure in which AlGaN layers and GaN layers are alternately formed on the AlN layer 389.

The GaN layer 370 may be further formed on the AlGaN layer 381. The GaN layer 370 may be an undoped-GaN (u-GaN) layer, for example The first type semiconductor layer 360 may be formed of a nitride semiconductor doped with an n-type impurity, e.g., n-$Al_xGa_yIn_zN$ (x+y+z=1). The active layer 350 may include single or multiple quantum wells obtained by varying x, y, and z values in $Al_xGa_yIn_zN$ to adjust a bandgap. The second type semiconductor layer 340 may be formed of a nitride semiconductor doped with a p-type impurity, e.g., p-$Al_xGa_yIn_zN$ (x+y+z=1).

The above-described nitride thin films may be formed by performing a semiconductor manufacturing process such as a metal organic chemical vapor deposition (MOCVD) process, for example.

Figure 3B:
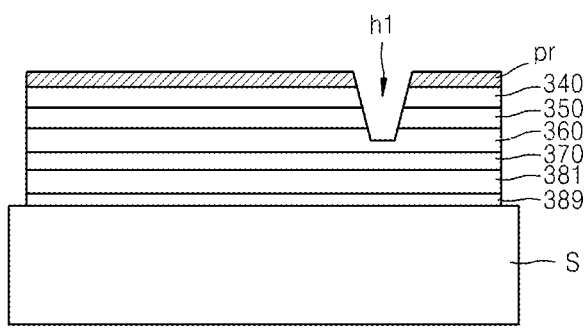

Referring to FIG. 3B, a through hole h1 is formed to penetrate through the second type semiconductor layer 340 and the active layer 350 and to expose a region of the first type semiconductor layer 360. The through hole h1 is prepared to form a first contact layer (not shown) contacting and for applying a voltage to the first type semiconductor layer 360. Initially, a photoresist layer pr is coated on the second type semiconductor layer 340 and then is patterned into a predetermined/desired pattern. The second type semiconductor layer 340, the active layer 350, and the first type semiconductor layer 360 are etched by using the photoresist layer pr as a mask, to form the through hole h1. The through hole h1 may be formed by performing a dry etching process, for example.

Figure 3C:
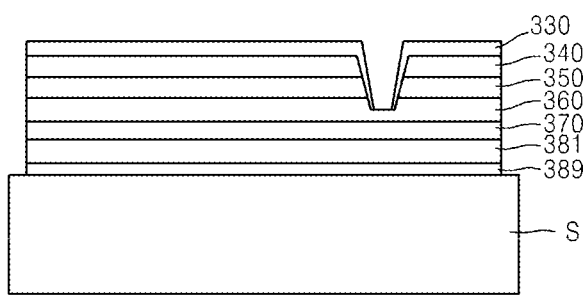

Referring to FIG. 3C, an insulating layer 330 is formed on a surface of the second type semiconductor layer 340 and a sidewall of the through hole h1. The insulating layer 330 may be formed of, for example, $SiO_2$.

Figure 3D:
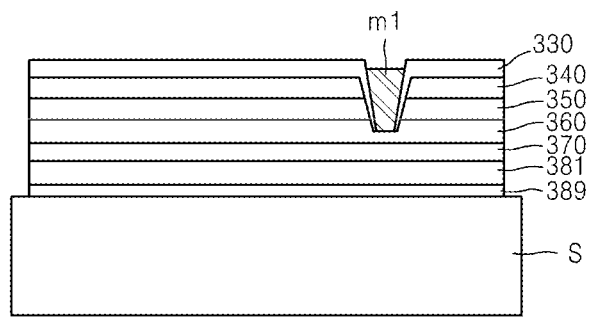

Referring to FIG. 3D, a first contact layer m1 that contacts the first type semiconductor layer 360 is formed by filling the through hole h1 with metal. The first contact layer m1 may be formed by depositing, for example, titanium/aluminum/titanium/platinum (Ti/Al/Ti/Pt).

Figure 3E:
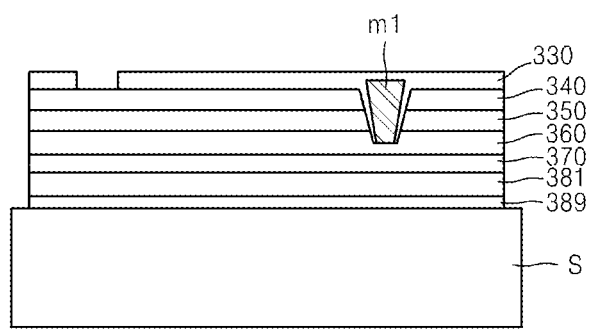

Referring to FIG. 3E, an insulating material is further coated to cover the first contact layer m1 and the insulating layer 330, and a portion of the insulating layer 330 on the second type semiconductor layer 340 is etched to expose a region of the second type semiconductor layer 340.

Figure 3F:
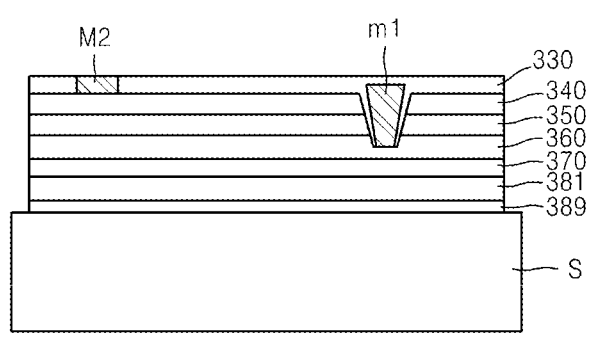

Referring to FIG. 3F, a second contact layer m2 is formed by filling the exposed portion with metal. The second contact layer m2 may be formed by depositing, e.g., nickel/silver/titanium/platinum (Ni/Ag/Ti/Pt).

Figure 3G:
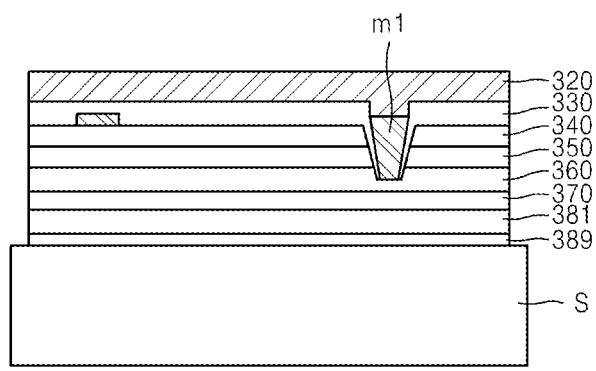

Referring to FIG. 3G, a metal layer 320 is formed on the insulating layer 330. In this case, an insulating material is further coated on the insulating layer 330 on the second contact layer m2 such that the metal layer 320 is insulated from the second contact layer m2, and a portion of the insulating layer 330 on the first contact layer m1 is removed such that the metal layer 320 contacts the first contact layer m1. The metal layer 320 may be formed by depositing, for example, titanium/gold/tin/gold/tin/gold (Ti/Au/Sn/Au/Sn/Au).

Figure 3H:
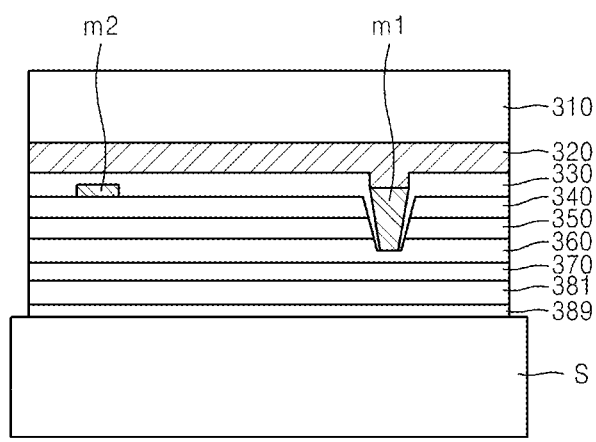

Referring to FIG. 3H, a second substrate 310 is bonded onto the metal layer 320. The second substrate 310 may be, for example, a silicon substrate, Si(100). The second substrate 310 may be bonded on the metal layer 320 by using a eutectic bonding method, for example.

Figure 3I:
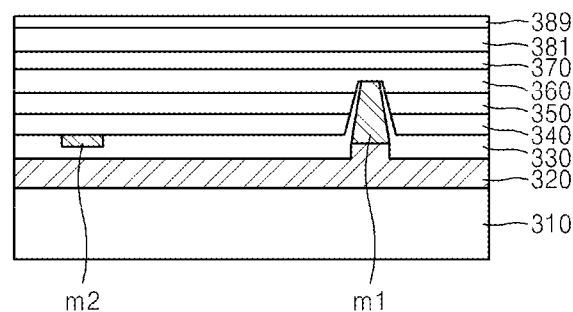

Referring to FIG. 3I, the first substrate S is removed. For example, a grinding or lapping process may be performed to reduce the thickness of the first substrate S, and then a dry or wet etching process may be performed. The lapping process and the etching process are performed together in order to reduce etching damages in nitride thin films, or may be performed individually one after the other. Also, since the first substrate S formed of silicon substrate is removed as described above, light extraction efficiency may be increased in comparison to a case when a sapphire substrate is used. If nitride thin films are formed on a sapphire substrate and then the sapphire substrate is removed by performing a laser lift-off (LLO) process, the output of light may be reduced due to laser impact.

Figure 3J:
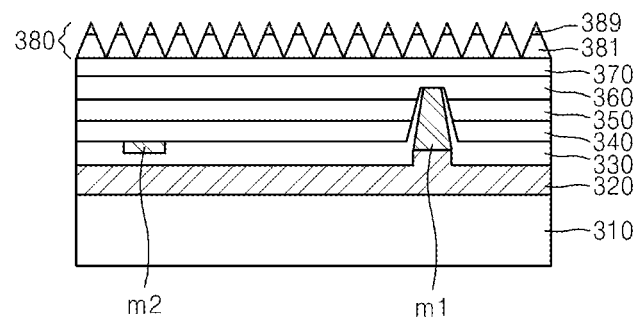

Referring to FIG. 3J, a surface texturing process is performed. The AlN layer 389 and the AlGaN layer 381 are patterned into a predetermined/desired pattern to form the emission pattern layer 380. The emission pattern layer 380 may have an uneven pattern having V-shaped recesses as illustrated in FIG. 3J, but is not limited thereto. Although the uneven pattern is formed by etching the AlN layer 389 and the AlGaN layer 381 in FIG. 3J, the uneven pattern may be formed by performing etching to a predetermined/desired depth in the AlGaN layer 381 or the GaN layer 370. The depth of the uneven pattern may be from about 500 nm to about 1500 nm. In the above-described surface texturing process, a wet etching process using potassium hydroxide (KOH) may be performed, for example. Since the wet etching process allows simultaneous etching of a plurality of layers in a short time, process cost and time are reduced. The uneven pattern having a depth of about 400 nm may be formed in about 5 to 10 minutes. The size of or the distance between unit pieces of the uneven pattern may be varied to increase light extraction efficiency. For example, the uneven pattern may be set to form multiple scattering points and to have a uniform size.

Figure 3K:
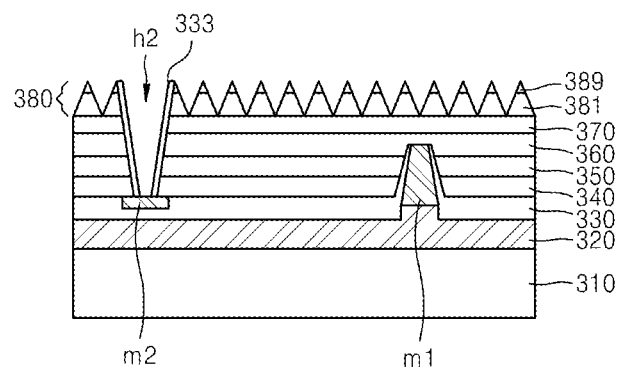

Referring to FIG. 3K, a through hole h2 is formed to penetrate through the emission pattern layer 380, the GaN layer 370, the first type semiconductor layer 360, the active layer 350, and the second type semiconductor layer 340 and to expose a region of the second contact layer m2. Like the through hole h1 formed in FIG. 3B, the through hole h2 may be formed by performing a photolithography process and an etching process, for example. Also, an insulating layer 333 is coated on a sidewall of the through hole h2.

Figure 3L:
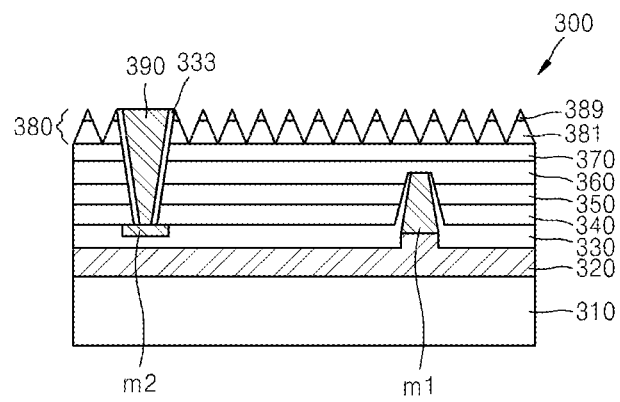

Referring to FIG. 3L, an electrode unit 390 is formed by depositing metal on the second contact layer m2 through the through hole h2. The electrode unit 390 may be formed by depositing, for example, Ti/Au. Although not shown in FIG. 3L, an electrode unit for applying a voltage to the first type semiconductor layer 360 through the metal layer 320 and the first contact layer m1 may be further formed on a lower surface of the second substrate 310.

In example embodiments, the first contact layer m1 and the second contact layer m2 are exemplarily formed to apply a voltage to the first type semiconductor layer 360 and the second type semiconductor layer 340, and their structures and/or forming processes may be varied.

As such, the LED 300 capable of reducing process cost and time and increasing light extraction efficiency is manufactured.

As described above, according to example embodiments, since MN and AlGaN for forming an emission pattern layer and nitride semiconductors for forming a light emitting structure are similar materials, the emission pattern layer and the light emitting structure have almost the same refractive index very little amount of light may be reflected at the boundaries between layers of an LED. Also, total reflection at a boundary to the external of the LED may be reduced due to a textured surface. Accordingly, light extraction efficiency of the LED may be increased.

In addition, process cost and time for manufacturing the LED may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of manufacturing a light-emitting device (LED), the method comprising:
   forming a buffer layer on a first substrate;
   sequentially forming a first semiconductor layer of a first impurity type, an active layer, and a second semiconductor layer of a second impurity type on the buffer layer;
   forming a first contact layer contacting the first semiconductor layer, and a second contact layer contacting the second semiconductor layer; and
   forming an emission pattern layer by removing the first substrate and patterning the buffer layer, wherein the forming of the first and second contact layers comprises,
      forming a first through hole penetrating through the second semiconductor layer and the active layer to expose a portion of the first semiconductor layer,
      forming an insulating layer on a surface of the second semiconductor layer and a sidewall of the first through hole,
      forming the first contact layer by filling the first through hole with metal, and
      forming the second contact layer by using metal on a portion of the second semiconductor layer, the second semiconductor layer being exposed by etching a portion of the insulating layer on the second semiconductor layer, and covering the second contact layer with an insulator.

2. The method of claim 1, further comprising forming a metal layer on the insulating layer and the first contact layer.

3. The method of claim 2, further comprising bonding a second substrate on the metal layer and removing the first substrate.

4. The method of claim 3, further comprising:
   forming a second through hole penetrating through the emission pattern layer, the first semiconductor layer, the active layer, and the second semiconductor layer to expose the second contact layer; and
   filling the second through hole with metal to contact the second contact layer.

5. The method of claim 1, further comprising removing the first substrate using a lapping process or an etching process.

6. The method of claim 1, wherein the buffer layer comprises an aluminum nitride (AlN) layer and an aluminum gallium nitride (AlGaN) layer.

7. The method of claim 1, wherein the buffer layer comprises an AlN layer, and AlGaN layers and gallium nitride (GaN) layers alternately formed on the AlN layer.

8. The method of claim 1, wherein the forming the emission pattern layer forms an uneven emission pattern layer on the buffer layer.

* * * * *